United States Patent [19]

Yamane et al.

[11] Patent Number: 4,803,384

[45] Date of Patent: Feb. 7, 1989

[54] PULSE AMPLIFIER SUITABLE FOR USE IN THE SEMICONDUCTOR LASER DRIVING DEVICE

[75] Inventors: Kazuo Yamane; Masakazu Mori, both of Kawasaki; Takashi Tsuda, Tokyo; Yoshinori Ohkuma; Kazuhiro Suzuki, both of Kawasaki, all of Japan

[73] Assignee: Fujitsu Limited, Kawasaki, Japan

[21] Appl. No.: 921,110

[22] Filed: Oct. 21, 1986

[30] Foreign Application Priority Data

Oct. 22, 1985 [JP] Japan .................................. 60-234634
Mar. 19, 1986 [JP] Japan .................................. 60-059464

[51] Int. Cl.$^4$ .......................... G06G 7/12; H03L 5/00; H01S 3/00
[52] U.S. Cl. .................... 307/490; 307/501; 307/546; 307/552; 307/554; 307/264; 372/38
[58] Field of Search ................. 372/38; 307/490, 501, 307/546, 552–554, 567, 568, 264

[56] References Cited

U.S. PATENT DOCUMENTS 4,162,412  7/1979  Mawhinney et al. ............... 307/554
4,327,329  4/1982  Papworth ............................ 307/490

Primary Examiner—William L. Sikes
Assistant Examiner—Georgia Y. Epps
Attorney, Agent, or Firm—Staas & Halsey

[57] ABSTRACT

A semiconductor laser driving device using FET's as a positive element in a bias current supply circuit and a pulse current supply circuit, and having compensating circuits for compensating differences in the characteristics of the FET's and a laser diode used in the driving device. Also a pulse amplifier suitable for use as the pulse current supply circuit in the semiconductor driving device, which circuit cuts off a pulse top side portion and a pulse base side portion of an input pulse with respect to a mesial point of the input pulse to obtain an output pulse having a desired pulse amplitude in response to a control signal, without varying a pulse width.

8 Claims, 10 Drawing Sheets

PULSE AMPLIFIER SUITABLE FOR USE IN THE SEMICONDUCTOR LASER DRIVING DEVICE

BACKGROUND OF THE INVENTION

1. Field of the Invention

The present invention relates to a semiconductor laser driving device and a pulse amplifier suitable for use as a pulse current supply circuit in the semiconductor laser driving device. This pulse amplifier varies a pulse amplitude of an output pulse in response to a control signal.

2. Description of the Related Art

Semiconductor laser driving device are used for controlling an excitation of the semiconductor laser, such as a laser diode, used as a light source in an optical communication system. The optical communication system is suitable for a large capacity data transmission, in which a laser diode must be driven at an ultra high transmission rate (G bit/s order). Accordingly, the semiconductor laser driving device and the pulse amplifier used therein, which can operate at the ultra high transmission rate, are required.

The semiconductor laser driving device in the prior art consists of a bias current supply circuit for supplying a bias current to the laser diode, a pulse current supply circuit for supplying a pulse current to the laser diode for exciting the laser diode to emit a light, and an automatic power control loop for controlling the magnitude of the base current and the pulse amplitude of the pulse current to maintain the output light of the laser diode at a constant power. The bias current and pulse current supply circuits are formed by using, as active elements, bipolar transistors having almost the same characteristics.

When the bipolar transistors are used, however, the transmission rate of the semiconductor laser driving device has an upper limit on the order of about 100s M bit/s and, therefore, the bipolar transistor can not be used for a semiconductor laser driving device operated at 1 G bit/s, which will become more necessary in the future. This limitation to the transmission rate is due to a physical characteristic of the bipolar transistor, and therefore, the transmission rate cannot be increased merely by changing a circuit construction of the driving device.

Accordingly, the use of an FET (Field Effect Transistor) capable of operating at high transmission rate, such as GaAs FET, has been proposed for the high speed operating type semiconductor laser driving device.

SUMMARY OF THE INVENTION

Accordingly, it is an object of the present invention to provide a semiconductor laser driving device capable of operating at high transmission rate by using FETs, and a pulse amplifier suitable for use as a pulse current supply circuit in the semiconductor laser driving device.

In accordance with one aspect of the present invention, there is provided a semiconductor laser driving device comprising a semiconductor laser, a bias current supply circuit for supplying a bias current to the semiconductor laser. The bias circuit comprises one or more FETs used as an active element. In addition, a pulse current supply circuit for supplying a pulse current for causing a light emission of the semiconductor laser in response to an input pulse signal is provided and comprises one or more FETs used as an active element. A power control circuit for controlling the bias current of the bias current supply circuit and the pulse current of the pulse current supply circuit to maintain a power of a light output by the semiconductor laser at a constant value in response to a monitoring light from the semiconductor laser, a first compensating circuit for compensating a control signal output from the power control circuit, to be adapted to a given operating characeristic of the bias current supply circuit, and a second compensating circuit for compensating the control signal outout from the power control circuit to be adapted to a given operating characteristic of the pulse current supply circuit are also provided.

In accordance with another aspect of the present invention, there is provided a pulse amplifier for varying a pulse amplitude of an input pulse in response to a control signal, comprising first and second FETs connected in cascade, wherein the first FET is formed so that the input pulse is input to a gate electrode thereof and a gate-source voltage variable in response to the control signal is biased so that one of top side portion and base side portion of the input pulse is cut off at the pinchoff voltage thereof. The second FET is formed so that the input pulse output from the first FET is input to a gate electrode thereof and a gate-source voltage is biased so that the side portion of the input pulse which is not cut off is cut off at a pinchoff voltage thereof.

BRIEF DESCRIPTION OF THE DRAWINGS

Embodiments of the semiconductor laser driving device according to the present invention will now be described in detail with reference to the accompanying drawings, in which.

DESCRIPTION OF THE PREFERRED EMBODIMENTS

For easy and better understanding of the present invention, a semiconductor laser driving device of prior and related arts, and their problems, are first described with reference to FIGS. 1 to 5.

Figure 1:
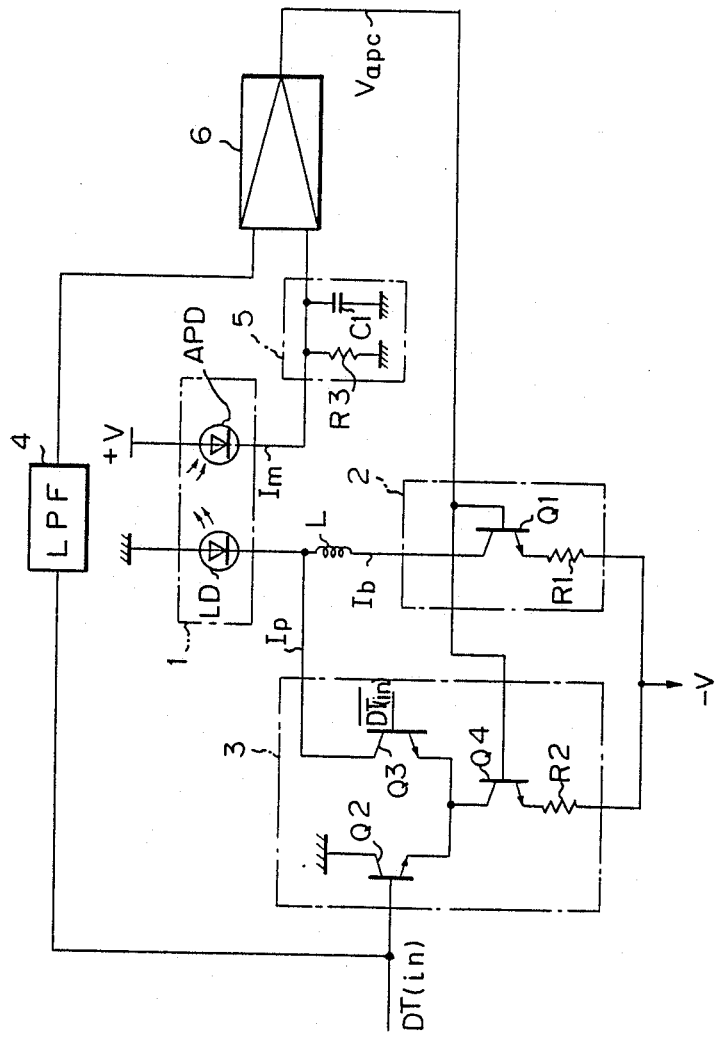
FIG. 1 is a semiconductor laser driving device according to the prior art.

FIG. 1 is a circuit diagram of a semiconductor laser driving device of the prior art. In FIG. 1, 1 is a laser diode module including a laser diode LD which outputs a forward laser light into a optical fiber (not shown), and at the same time, a backward laser light as a monitoring light to be monitored, and an avalanche photodiode APD which receives the monitoring light and converts it into a monitoring current $I_m$; 2 is a bias current supply circuit for supply a DC bias current to the laser diode LD, and includes a bipolar transistor Q1 and a resistor R1; 3 is a pulse current supply circuit for supplying a pulse current to the laser diode LD in such a manner that the pulse current is superimposed on the bias current and includes bipolar transistors Q2 to Q4 and a resistor R2; 4 is a low pass filter for extracting a low frequency component of data input pulse DT(in); 5 is a low pass filter for extracting a low frequency component of the monitoring current Im output from the avalanche photodiode APD; 6 is an automatic power control circuit formed by a differential amplifier, for supplying an automatic power control voltage $V_{apc}$ proportional to a difference between two inputs from the low pass filters 4 and 5 to a base of the transistor Q1 of the bias current supply circuit 2 and a base of the transistor Q4 of the pulse current supply circuit 3; and L is a coil for cutting off an AC component. The pulse current supply circuit 3 receives data input pulses DT(in) at a base of the transistor Q2 to supply a pulse current $I_p$ corresponding to the input pulse DT(in) to the laser diode LD. An inverted input pulse $\overline{DT(in)}$ is input to a base of the transistor Q3.

Figure 2:
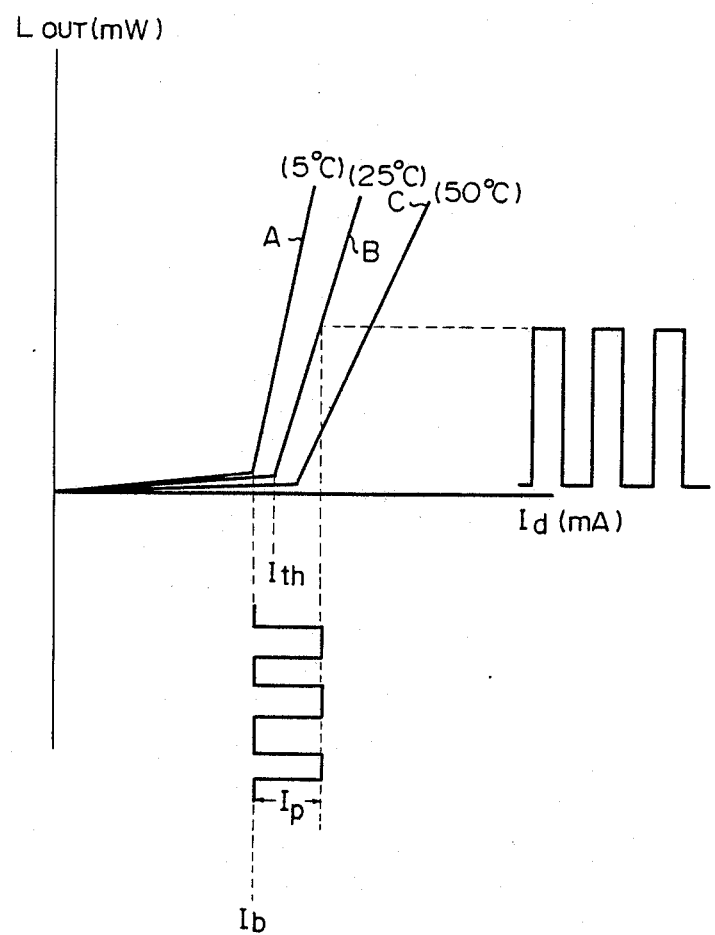
FIG. 2 is a graph of the operating characteristic of a laser diode.

FIG. 2 is a graph showing an operating characteristic of the laser diode. The abscissa denotes a driving current $I_d$ flowing through the laser diode LD and the ordinate denotes an output power L of the laser light emitted from the laser diode. In FIG. 2, the characteristic curves A, B, and C correspond to operating temperatures of 5° C., 25° C., and 50° C., respectively. As shown in FIG. 2, the bias current $I_b$ is a DC current slightly lower than a threshold current $I_{th}$ of the laser diode LD. The pulse current $I_p$ is superimposed on the bias current $I_b$, whereby the pulselike laser light corresponding to the pulse current $I_p$ is output from the laser diode LD.

The low pass filters 4 and 5 and the control circuit 6, together with the bias current and pulse current supply circuits 2 and 3, from an automatic power control loop for stabilizing the light output from the laser diode LD. That is, as shown in FIG. 2, the threshold current $I_{th}$ and a differential quantum efficiency of the laser diode LD vary in accordance with the temperature. For example, assuming an identical driving current $I_d$, when the temperature is low the light output power $L_{out}$ increases, and when the temperature is high the light output power decreases. Accordingly, the light output from the laser diode LD varies with respect to the temperature. The automatic power control loop is provided for compensating this variation, by comparing the average value of the input pulses DT(in) output from the low pass filter 4 with the average value of the monitoring current $I_m$ output from the low pass filter 5 at the control circuit 6, then outputting the control voltage $V_{apc}$ to make these average values coincide and thus control the bias current $I_b$ and the pulse current $I_p$, thereby maintaining the output light at a constant value.

The bias value $I_b$ is proportional to $V_{apc}/R1$, where the resistance of the resistor R1 is designed to compensate for variations in temperature of the threshold current $I_{th}$ of the laser diode. The pulse current $I_p$ is proportional to $V_{apc}/R2$, where the resistance of the resistor R2 is designed to compensate for variations in temperature of the differential quantum efficiency of the laser diode LD.

As described above, the feedback control is performed on the basis of the average values of the pulse train output from the low pass filters 4 and 5, because a feedback control by which a peak value of the light output pulse is maintained at a constant value by following up each of the input pulses DT(in) is difficult, due to the high transmission rate thereof.

In this semiconductor laser driving device, the monitoring light from the laser diode LD is detected by the photodiode APD, and a pulse amplitude of the pulse current supplied from the pulse current supply circuit 3 and the value of the DC bias current supplied from the bias current supply circuit are fedback in response to the detected value of the monitoring light, and thus an automatic power control of the output light is carried out to maintain a constant average value of the output light.

As described above, the semiconductor laser driving device shown in FIG. 1 uses bipolar transistors as active elements in the bias current and pulse current supply circuits 2 and 3. The bipolar transistors are used because the differences between the base voltage and collector current characteristics of each device are small, and accordingly, in the automatic power control loop, the output of the control circuit 6 may be directly fedback to the transistors Q1 and Q4.

When using the bipolar transistor, however, the transmission rate is limited to, for example, an upper order of 100s Mb/s, which can not cope with a demand for a 1 Gb/s transmission rate, which demand will become greater in the future.

Figure 3:
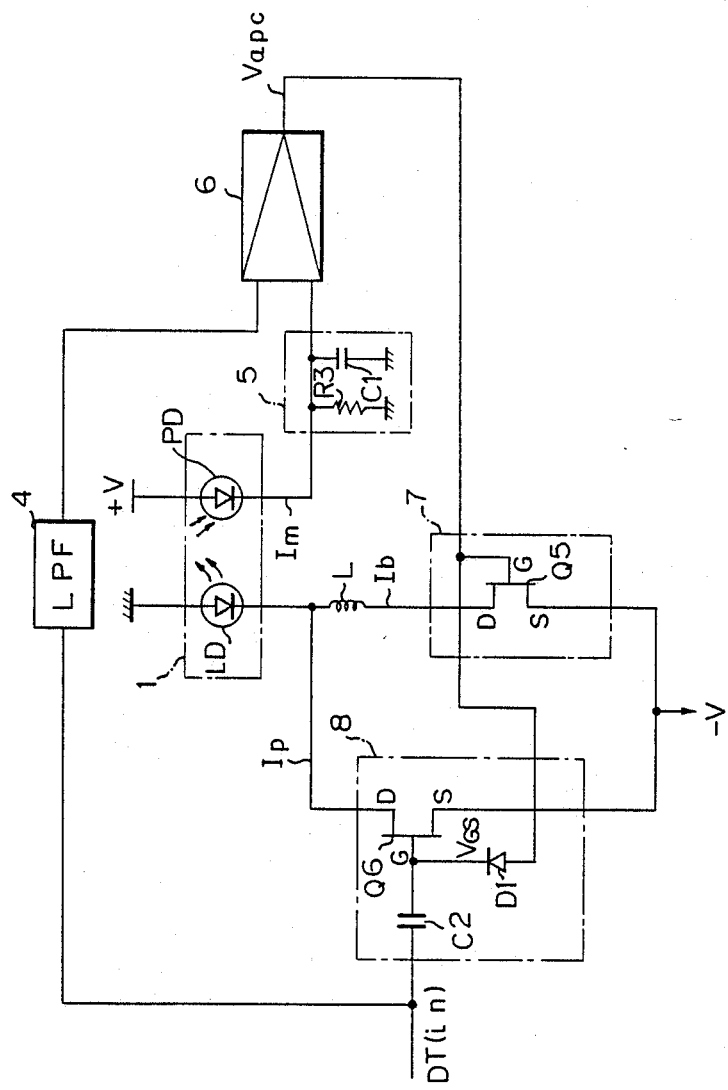
FIG. 3 is a circuit diagram semiconductor laser driving device.

FIG. 3 is a circuit diagram of a prior art semiconductor laser driving device, in which high speed FETs capable of operating at a transmission rate of 1 to 2 Gb/s order, such as Gallium Arsenide FETs, are used as active elements in the bias current and pulse current supply circuits. This driving device is intended to further increase the transmission rate. In FIG. 3, parts bearing the same reference numerals as shown in FIG. 1 denote the same parts having the same function.

As shown in FIG. 3, a bias current supply circuit 7 includes an FET Q5 with a gate to which the control voltage $V_{apc}$ is input. A pulse current supply circuit 8 includes a capacitor C2, an FET Q6 with a gate to which the input pulse DT(in) is input, and a low level clamping diode D1 through which the control voltage $V_{apc}$ is applied to the gate of the FET Q6.

In this semiconductor laser driving device, gate-source voltages of the FETs Q5 and Q6 are varied according to the control voltage $V_{apc}$, and accordingly, the magnitude of the bias current $I_b$ and the pulse amplitude of the pulse current $I_p$ are varied to perform an automatic power control.

Figure 4:
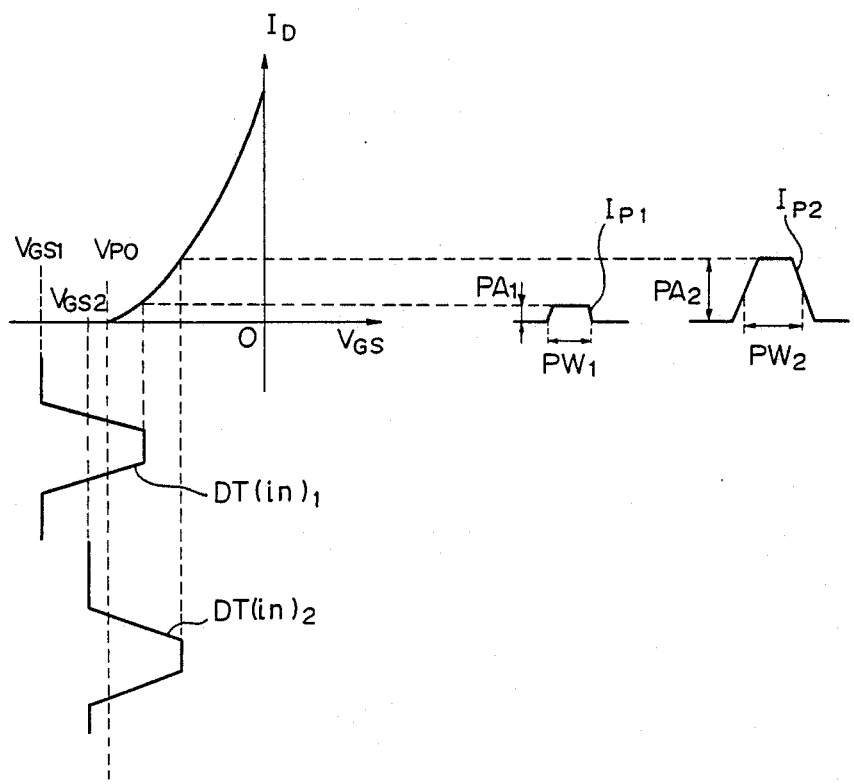
FIG. 4 is a graph of a $V_{GS}-I_D$ characteristic of the FET Q6 in FIG. 3.

The operation in the pulse current supply circuit 8 will be explained below in more detail. The supply circuit 8 supplies a pulse current $I_p$ corresponding to an input pulse DT(in), the pulse current amplitude of which is varied in response to the control voltage $V_{apc}$, to the laser diode LD. FIG. 4 is a graph showing a $V_{GS}-I_D$ characteristic of the FET Q6, in which $V_{po}$ denotes a pinchoff voltage of the FET Q6.

As is clear from FIG. 4, when the gate-source voltage $V_{GS}$ is biased at $V_{GS1}$, a level of a pulse base of the input pulse DT(in)$_1$ becomes $-V_{GS1}$, and thus an upper side portion of the input pulse DT(in) is cut off at the pinchoff voltage $V_{po}$, and a residual part thereof is output to the laser diode LD as the pulse current $I_{p1}$. In this case, the pulse amplitude becomes PA$_1$. On the other hand, when the gate-source voltage $V_{GS}$ of the FET Q6 is biased at $V_{GS2}$, which is higher than $V_{GS1}$, the portion of the input pulse DT(in)$_2$ cut off at the pinchoff voltage V$_{po}$ becomes greater than the cut off portion of the input pulse DT(in)$_1$, and the residual part thereof is output as the pulse current I$_{p2}$ having a pulse amplitude PA$_2$ greater than the pulse amplitude PA$_1$. That is, PA$_1$ < PA$_2$. As described above, the pulse amplitude of the pulse current I$_p$ is varied in response to the control voltage V$_{apc}$, which varies the gate-source voltage V$_{GS}$ of the FET Q6.

This pulse current supply circuit 8, however, has the problems described below. That is, in general, the pulse width is defined as a width between mesial points of the pulse amplitude of the pulse. When the transmission rate of the data input pulse DT(in) becomes very high, the pulse DT(in) has a trapezoidal waveform shown in FIG. 4 instead of a rectangular waveform, since a rise time and a fall time of the pulse cannot be ignored with respect to the pulse width. As a result, the pulse width of the pulse current I$_p$ is varied according to the position at which the input pulse DT(in) is sliced by the pinchoff voltage V$_{po}$, i.e., the magnitude of the control voltage V$_{apc}$. For example, in FIG. 4, the pulse width of the pulse current I$_{p1}$ becomes PW$_1$, and the pulse width of the pulse current I$_{p2}$ becomes PW$_2$, where PW$_1$ < PW$_2$.

Accordingly, when the automatic power control of the output light is carried out, the pulse width of the pulse current supplied to the laser diode LD may be varied, which will cause variations in a duty factor defined as a ratio of the pulse width to the pulse repetition frequency. As a result of these variations, various adverse influences such as a variation of a peak magnitude of the output light and a distortion of an equivalent waveform at a receiver side, etc., undesirably occur. This phenomenon is more notable as the transmission rate increase and prevents the driving device from attaining an increased transmission rate.

Figure 5:
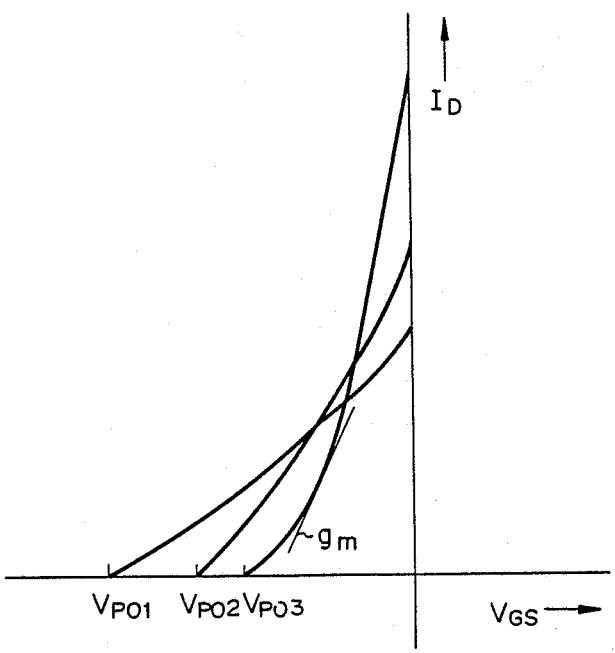
FIG. 5 is a graph of the differences of the $V_{GS}-I_D$ characteristics of the FETs in FIG. 3.

Further, similar to the problem of the driving device shown in FIG. 3, the characteristics of the FETs used in the pulse current and bias current supply circuits, such as the V$_{GS}$–I$_D$ characteristic, are different for each device. FIG. 5 is a graph showing differences of the V$_{GS}$–I$_D$ characteristics of the FETs. In The graph, the V$_{GS}$–I$_D$ characteristics of three FETs each having a different characteristic are denoted, respectively. The three FETs have pinchoff voltages V$_{po1}$, V$_{po2}$, and V$_{po3}$, respectively. Further, each slope of the characteristic curves, i.e., mutual conductance gm, is different not only for each FET but also in accordance with the magnitude of the gate-source voltage V$_{GS}$.

Figure 6:
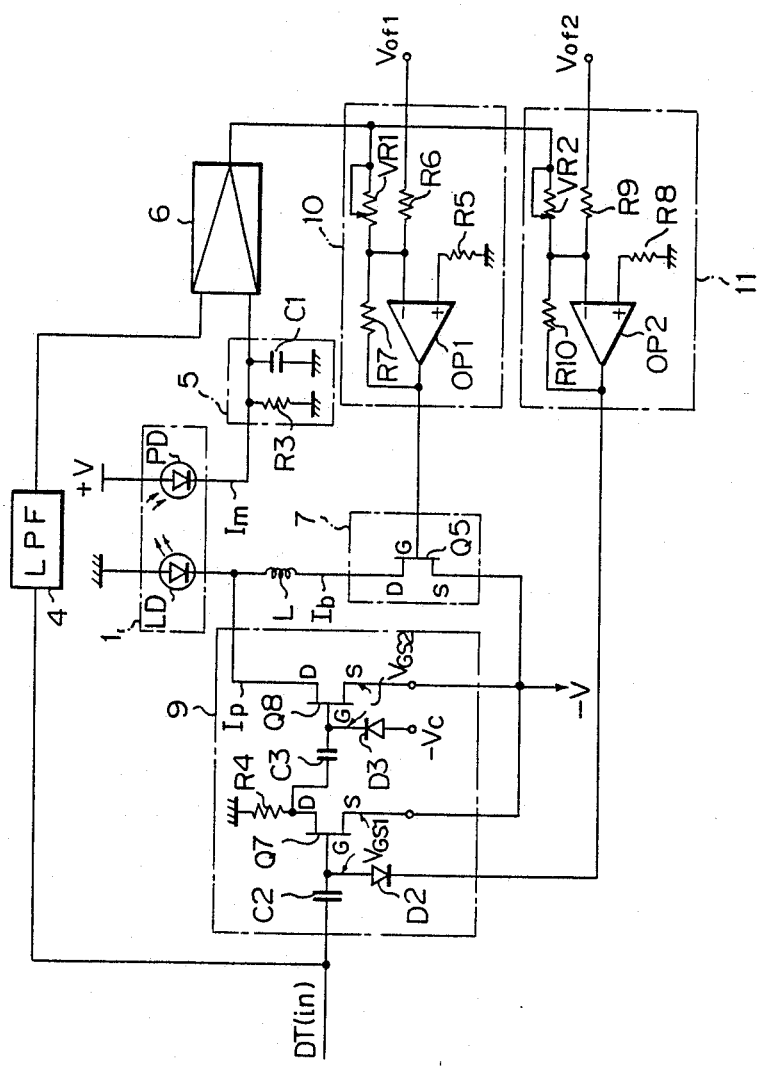
FIG. 6 is a circuit diagram of an embodiment of a semiconductor laser driving device according to the present invention.

A preferred embodiment of the present invention will now be explained with reference to FIGS. 6 to 9. FIG. 6 is a view of an embodiment of the semiconductor laser driving device according to the present invention. In FIG. 6, parts bearing the same reference numerals as shown in FIG. 3 are parts having the same function, respectively. The embodiment of FIG. 6 is different from that of FIG. 3 in that a pulse current supply circuit 9 comprises two FETs Q7 and Q8 connected in cascade, and the control voltage V$_{apc}$ output from the power control circuit 6 is input to the bias current supply circuit 7 and the pulse current supply circuit 9 via compensating circuits 10 and 11, respectively. p The compensating circuit 10 comprises an operational amplifier OP1, resistors R5 to R7, and a variable resistor VR1 for adjusting a gain. The circuit 10 is formed so that an offset adjusting voltage V$_{of1}$ can be applied to an inverting terminal of the operational amplifier OP1. In the same way, the compensating circuit 11 comprises an operational amplifier OP2, resistors R8 to R10, and a variable resistor VR2, and is formed so that an offset adjusting voltage V$_{of2}$ can be applied to an inverting terminal of the operational amplifier OP2.

The pulse current supply circuit 9 is formed by two stage FETs Q7 and Q8 connected in cascade. The first stage FET Q7 receives at the gate thereof the data input pulse DT(in) through a capacitor C2, and at the same time, receives the control voltage V$_{apc}$ from the control circuit 6 through the compensating circuit 11 and a diode D2. A constant voltage power supply (−V) is connected to the source of the FET Q7. Therefore, the gate-source voltage V$_{GS1}$ of the FET Q7 can be varied in response to the control voltage V$_{apc}$, which causes the variations of the pulse amplitude of the pulse current I$_p$.

The diode D2 is a high level side clamping diode for the input pulse DT(in). The FET Q7 outputs an output pulse signal from the drain thereof grounded through the resistor R4 to the gate of the next stage FET Q8 through a capacitor C3. The gate of the FET Q8 is connected to the constant voltage power source (−V$_c$) through a low level side clamping diode D3, and the source thereof is connected to the constant voltage power source (−V). Accordingly, the gate-source voltage V$_{GS2}$ of the FET Q8 is constant. The drain of the FET Q8 is connected to the laser diode LD, and thus the output pulse current I$_p$ is supplied to the laser diode LD.

Figure 7:
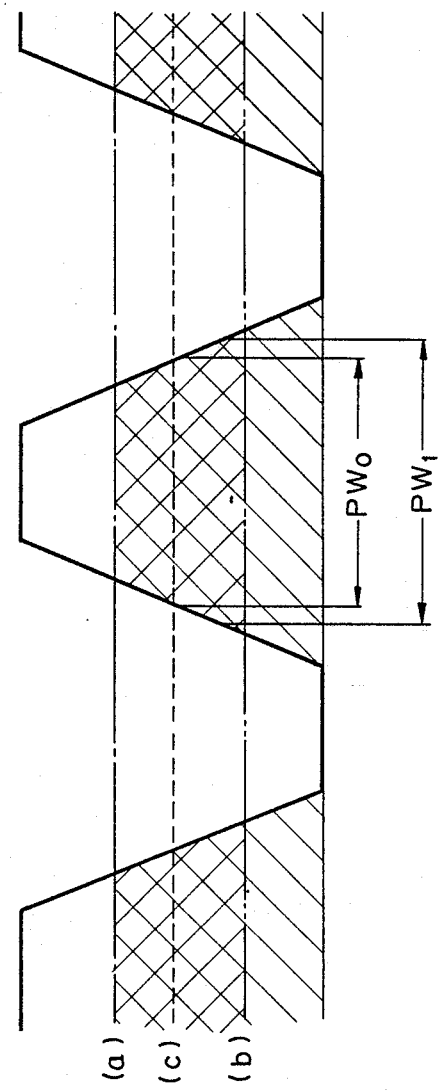
FIG. 7 is a diagram for explaining a principle of the operation of the pulse current supply circuit in FIG. 6.
Figure 8:
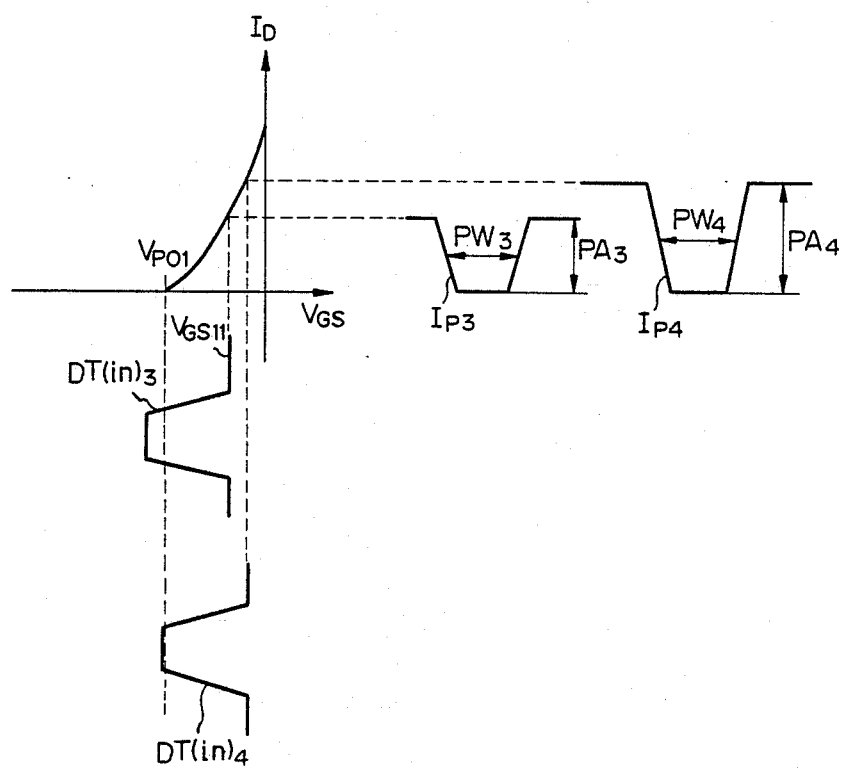
FIGS. 8 and 9 are graphs for explaining the operation of the pulse current supply circuit in FIG. 6.
Figure 9:
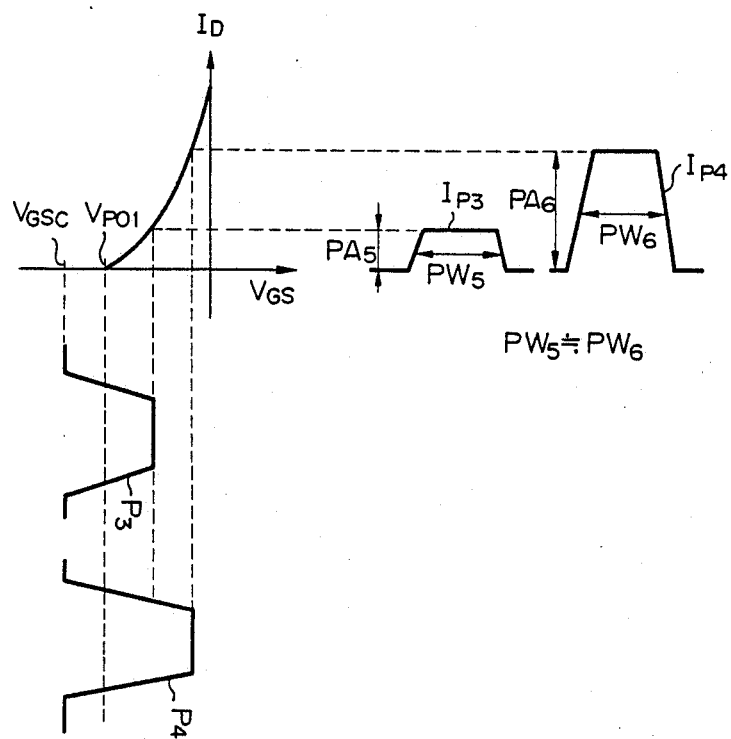

The operation of the pulse current supply circuit 9 will be explained with reference to FIGS. 7 to 9 below. FIG. 7 is a diagram for explaining a principle of the operation of the circuit 9. First, a principle of the operation of the pulse current supply circuit 9 will be explained with reference to FIG. 7. FIG. 7 shows a pulse waveform having a pulse width PW$_o$ corresponding to the width between mesial points between the pulse top and pulse base, the duty factor of which is 50%. The pulse waveform is cut off along the broken line (a) by the pinch-off voltage V$_{po1}$ of the first stage FET Q7 to obtain the waveform portion below the broken line (a) (the portion shown by oblique lines). In this case, the pulse width PW$_1$ of the obtained pulse waveform, i.e., the width between mesial points between the pulse top and the pulse base, becomes greater than the pulse width PW$_0$. Accordingly, the duty factor thereof becomes greater than 50%.

The obtained pulse waveform (the portion shown by oblique lines) is then cut off along one-dot chain line (b) by the pinch-off voltage V$_{po2}$ of the FET Q8 to obtain the portion above the one-dot chain line (b) (the cross-hatched). As a result, the obtained pulse waveform has a pulse width very close to the pulse width PW$_0$, and a duty factor of almost 50%. As described above, the original pulse waveform is sliced at the upper side portion and lower side portion with respect to the mesial point thereof, so that the pulse width and duty factor may be kept almost constant.

The detailed operation of the pulse current supply circuit 9 will now be explained. FIG. 8 is a graph of the I$_D$–V$_{GS}$ characteristic of the FET Q7, in which input and output waveforms are denoted. FIG. 9 is a graph of the I$_D$–V$_{GS}$ characteristic of the FET Q8, in which input and output waveforms are also denoted.

In this embodiment, the input pulse DT(in) input to the FET Q7 is a negative logic level pulse and has a constant pulse width. In FIG. 8, when the gate-source voltage V$_{GS1}$ of the FET Q7 is biased at the voltage $V_{GS11}$ higher than the pinch-off voltage $V_{po1}$, the input pulse DT(in)$_3$ having a pulse base level of $-V_{GS11}$ is cut off at the pinch-off voltage $V_{PO1}$ to eliminate the pulse top side portion, i.e. logic "1" side portion, so that the output pulse current $I_{p3}$ has a pulse amplitude PA$_3$ and a pulse width PW$_3$.

On the other hand, when the gate-source voltage $V_{GS1}$ of the FET Q7 is biased at the voltage $V_{GS12}$ higher than the voltage $V_{GS11}$, the portion of the input pulse DT(in)$_4$ eliminated by cutting off at the pinch-off voltage $V_{po1}$ becomes smaller in comparison with that of the input pulse DT(in)$_3$. Accordingly, the output pulse current $I_{p4}$ has a pulse amplitude PA$_4$ and a pulse width PW$_4$, where PA$_3$<PA$_4$ and PW$_3$>PW$_4$.

The output pulse current $I_{p3}$ or $I_{p4}$ of the FET Q7 is then converted into the output pulse voltage P$_3$ or P$_4$ to be input to the second stage FET Q8. The pulse base of the input pulse, i.e., "0" level of the input pulse, is arranged at a constant voltage $V_{GSC}$. In this state wherein the "0" level of the input pulse is arranged, the input pulse P$_3$ or P$_4$ corresponding to the pulse current $I_{p3}$ or $I_4$ respectively is cut off at the same position of the pulse base side, to cut off the pulse base side portion thereof with respect to the mesial point of the original input data pulse DT(in) respectively, and then output as the output pulse current $I_{p3}$ or $I_{p4}$ having the pulse amplitude PA$_5$ or PA$_6$ and pulse width PW$_5$ or PW$_6$, respectively. As a result, the output pulse currents $I_{p3}$ or $I_{p4}$ have almost the same pulse width PW$_5$ or PW$_6$, but have a different pulse amplitude PA$_5$ or PA$_6$ varied according to the variation of the gate-source voltage $V_{GS1}$ of the first state FET Q7, respectively. Thus, the control for varying the pulse amplitude without varying the pulse width is realized.

Note, in the pulse current supply circuit 9 described above, the gate-source voltage $V_{GS1}$ of the first stage FET Q7 is variable, but the gate-source voltage $V_{GS2}$ of the second stage FET Q8 is fixed.

Nevertheless, to absorb a variation of the pinch-off voltage of the FET, it may be desirable to vary the gate-source voltage $V_{GS2}$ of the FET Q8.

The operation of compensating the difference in each FET characteristic by the compensating circuits 10 and 11 will now be explained. When the FET Q5 and Q7 have individual different characteristics, for example, as shown in FIG. 5, the difference in the pinch-off voltage, such as $V_{po1}$, $V_{po2}$, or $V_{po3}$, is easily compensated by varying the offset voltages $V_{of1}$ and $V_{of2}$ of the operational amplifiers OP1 and OP2. Further, the difference between the mutual conductances of each FET is compensated by adjusting the gains of the operational amplifiers OP1 and OP2 by means of the variable resistors VR1 and VR2, to vary the magnitudes of the control voltage $V_{apc}$ supplied from the control circuit 6 to the pulse current and bias current supply circuits 7 and 9 respectively.

In the example described above, compensation is made only for a deviation of the characteristic of the FET. In practice, however, not only the deviation of the characteristic of the FET but also a deviation of the differential quantum efficiency and the threshold current of the laser diode may be compensated by adjusting the gains of the operational amplifiers OP1 and OP2 by means of the variable resistors VR1 and VR2 and offset voltages $V_{of1}$ and $V_{of2}$.

Although a preferred embodiment has been described hereinbefore, various modifications and alterations are possible within the scope of the present invention. For example, in the example described in FIG. 6, the input pulse DT(in) input to the pulse current supply circuit 9 has a negative logic, but a positive logic input pulse also may be utilized.

Figure 10:
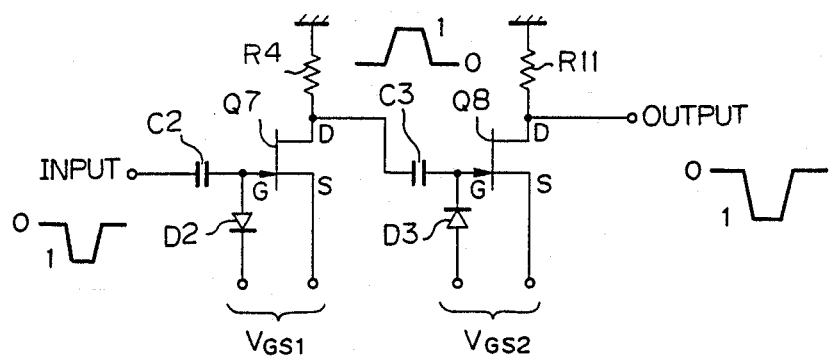
FIG. 10 is a circuit diagram of a pulse amplifier according to the present invention.

Further, the use of the pulse amplifier according to the present invention is not limited to the pulse current supply circuit as described above. FIG. 10 is a circuit diagram of a pulse amplifier, according to the present invention, which has a general configuration. When the pulse amplifier used as the pulse current supply circuit 9 shown in FIG. 6, is used for another purpose, in general, the drain of the FET Q8 is grounded through the load resistor R11 instead of the laser diode LD.

What is claimed is:

1. A pulse amplifier for varying a pulse amplitude of an input pulse in response to a control signal, comprising:

first and second FETs connected in cascade and having pinch-off voltages determined by gate-source voltages under which currents flowing at their drains become zero;

said first FET formed having a gate electrode connected to receive an input pulse and a gate-source voltage variable in response to a control signal and having a drain, said first FET biased such that, at the output of the drain, a first pulse is cut off at an upper portion and a lower portion of the inpout pulse at a pinch-off voltage thereof; and said second FET having a gate connected to receive the input pulse output from said first FET, having a drain and having a gate-source voltage biased such that the drain outputs a second pulse cut-off at the side portions of the first pulse corresponding to the upper and lower portions of the input pulse which are not cut off.

2. A pulse amplifier according to claim 1, wherein said first FET cuts off the upper portion of the input pulse to obtain an input pulse waveform extending from a zero level to a predetermined level, and wherein said second FET cuts off the lower portion of the input pulse to obtain an input pulse waveform extending from a peak level to a predetermined level.

3. A pulse amplifier according to claim 1, wherein said first FET cuts off the lower portion of the input pulse to obtain the input pulse waveform extending from a peak level to a predetermined level, and wherein said second FET cuts off the upper portion of the input pulse to obtain the input pulse waveform extending from a zero level to a predetermined level.

4. A pulse amplifier according to claim 1, further comprising a first voltage control means, connected to said first FET, for varying a gate-source voltage of said first FET for varying a pulse base level of the input pulse.

5. A pulse amplifier according to claim 4, further comprising a second voltage control means, connected to said second FET, for controlling a gate-source voltage of the second FET.

6. A pulse amplifier according to claim 4, further comprising a diode connected to the gate of said FET, wherein said first voltage control means is connected to the gate of said first FET having a source voltage fixed at a constant value through said diode for clamping a zero level of the input pulse signal so as to variably control the gate voltage thereof.

7. A pulse amplifier according to claim 5, further comprising a diode connected to the gate of said second FET, wherein said second voltage control means is connected to the gate of said second FET through said diode for clamping a zero level of the output pulse signal of said first FET.

8. A pulse amplifier according to claim 2, wherein the input pulse signal is a negative logic pulse signal, the drains of said first and second FETs are connected to ground, and said first voltage control means and said second voltage control means are negative voltage sources.

* * * * *

UNITED STATES PATENT AND TRADEMARK OFFICE
CERTIFICATE OF CORRECTION

PATENT NO. : 4,803,384
DATED : FEBRUARY 7, 1989
INVENTOR(S) : KAZUO YAMANE ET AL.

It is certified that error appears in the above-identified patent and that said Letters Patent is hereby corrected as shown below:

Col. 1, line 14, "device" should be --device,--;
line 62, "laser, a" should be --laser, and a--.

Col. 2, line 12, "outout" should be --output--.

Col. 3, line 40, "from" should be --form--.

Col. 5, line 62, delete "p".

Col. 6, line 52, "hatched)." should be --hatched portion).--.

Col. 7, line 22, "$I_4$" should be --$I_{p4}$--.

Col. 8, line 28, "inpout" should be --input--;
line 61, "the" should be --said--.

Signed and Sealed this

First Day of August, 1989

Attest:

DONALD J. QUIGG

Attesting Officer

Commissioner of Patents and Trademarks